(12) United States Patent
Tanaka

(10) Patent No.: US 10,879,483 B2
(45) Date of Patent: Dec. 29, 2020

(54) ORGANIC ELECTROLUMINESCENT DEVICE AND ILLUMINATION DEVICE

(71) Applicant: LUMIOTEC INC., Yonezawa (JP)

(72) Inventor: Junichi Tanaka, Yonezawa (JP)

(73) Assignee: LUMIOTEC INC., Yamagata (JP)

( * ) Notice: Subject to any disclaimer, the term of this patent is extended or adjusted under 35 U.S.C. 154(b) by 0 days.

(21) Appl. No.: 16/485,127

(22) PCT Filed: Feb. 9, 2018

(86) PCT No.: PCT/JP2018/004624
§ 371 (c)(1),
(2) Date: Aug. 9, 2019

(87) PCT Pub. No.: WO2018/147418
PCT Pub. Date: Aug. 16, 2018

(65) Prior Publication Data
US 2020/0013978 A1 Jan. 9, 2020

(30) Foreign Application Priority Data
Feb. 10, 2017 (JP) ................... 2017-023309

(51) Int. Cl.
*H01L 51/50* (2006.01)
*H01L 51/52* (2006.01)

(52) U.S. Cl.
CPC ........ *H01L 51/504* (2013.01); *H01L 51/5056* (2013.01); *H01L 51/5072* (2013.01)

(58) Field of Classification Search
CPC ............... H01L 51/504; H01L 51/5036; H01L 51/5056; H01L 51/5072
(Continued)

(56) References Cited

U.S. PATENT DOCUMENTS

2003/0189401 A1 10/2003 Kido et al.
2006/0066220 A1* 3/2006 Choong ............. H01L 51/5265
                                                   313/501
(Continued)

FOREIGN PATENT DOCUMENTS

JP  2003-272860 A  9/2003
JP  2006-165271 A  6/2006
(Continued)

OTHER PUBLICATIONS

International Search Report for PCT/JP2018/004624 (PCT/ISA/210) dated Apr. 3, 2018.
(Continued)

*Primary Examiner* — Christopher M Raabe
(74) *Attorney, Agent, or Firm* — Birch, Stewart, Kolasch & Birch, LLP

(57) ABSTRACT

An organic electroluminescent device wherein, among the distribution characteristics of light emitted inside a substrate: the brightness of white light has a maximum value within an angle range of 20-60° from an axis perpendicular to the planar direction of the substrate; the spectral radiance of red light at the maximum emission wavelength and the spectral radiance of green light at the maximum emission wavelength have maximum values within the angle range of 30-70° from the axis perpendicular to the planar direction of the substrate; and the maximum values are greater than the value for spectral radiance of red light at the maximum emission wavelength and the value for the spectral radiance of green light at the maximum emission wavelength, in the axial direction perpendicular to the planar direction of the substrate.

14 Claims, 11 Drawing Sheets

(58) Field of Classification Search
USPC .......................................................... 313/504
See application file for complete search history.

(56) References Cited

U.S. PATENT DOCUMENTS

| | | | |
|---|---|---|---|
| 2006/0091380 A1* | 5/2006 | Yuuki | H01L 51/5281 257/40 |
| 2007/0182317 A1 | 8/2007 | Kido et al. | |
| 2012/0025180 A1 | 2/2012 | Matsumoto | |
| 2012/0132895 A1 | 5/2012 | Kido et al. | |
| 2012/0248970 A1 | 10/2012 | Okuyama et al. | |
| 2014/0151648 A1 | 6/2014 | Kido | |
| 2015/0207092 A1* | 7/2015 | Tsuji | H01L 51/5221 257/40 |
| 2015/0249230 A1 | 9/2015 | Kido | |
| 2015/0340635 A1* | 11/2015 | Ahn | H01L 27/322 257/40 |
| 2016/0359143 A1 | 12/2016 | Osawa et al. | |
| 2018/0277796 A1 | 9/2018 | Kido et al. | |
| 2018/0277797 A1 | 9/2018 | Kido et al. | |
| 2018/0351134 A1 | 12/2018 | Kido et al. | |
| 2020/0028121 A1* | 1/2020 | Tanaka | H01L 51/5278 |
| 2020/0176714 A1* | 6/2020 | Fusella | H01L 51/5262 |

FOREIGN PATENT DOCUMENTS

| | | |
|---|---|---|
| JP | 2012-227122 A | 11/2012 |
| JP | 2014-22099 A | 2/2014 |
| JP | 2016-110702 A | 6/2016 |
| JP | 2016-225221 A | 12/2016 |
| WO | WO 2010/113493 A1 | 10/2010 |

OTHER PUBLICATIONS

Written Opinion of the International Searching Authority for PCT/JP2018/004624 (PCT/ISA/237) dated Apr. 3, 2018.

* cited by examiner

FIG.3

| CATHODE 100nm |
|---|
| ELECTRON TRANSPORT LAYER 58nm |
| RED LIGHT EMITTING LAYER 30nm 2% |
| HOLE TRANSPORT LAYER 65nm |
| CHARGE GENERATING LAYER 11nm |
| ELECTRON TRANSPORT LAYER 18nm |
| BLUE LIGHT EMITTING LAYER 25nm 5% |
| HOLE TRANSPORT LAYER 40nm |
| CHARGE GENERATING LAYER 11nm |
| ELECTRON TRANSPORT LAYER 8nm |
| GREEN LIGHT EMITTING LAYER 35nm 15% |
| HOLE TRANSPORT LAYER 100nm |
| ANODE 100nm |
| GLASS SUBSTRATE 0.7mm |

FIG.6

| CATHODE 100nm |
| --- |
| ELECTRON TRANSPORT LAYER 48nm |
| RED LIGHT EMITTING LAYER 30nm 2% |
| HOLE TRANSPORT LAYER 85nm |
| CHARGE GENERATING LAYER 11nm |
| ELECTRON TRANSPORT LAYER 18nm |
| BLUE LIGHT EMITTING LAYER 25nm 5% |
| HOLE TRANSPORT LAYER 40nm |
| CHARGE GENERATING LAYER 11nm |
| ELECTRON TRANSPORT LAYER 8nm |
| GREEN LIGHT EMITTING LAYER 35nm 15% |
| HOLE TRANSPORT LAYER 100nm |
| ANODE 100nm |
| GLASS SUBSTRATE 0.7mm |

FIG.9

| |
|---|
| CATHODE 150nm |
| ELECTRON TRANSPORT LAYER 56nm |
| RED LIGHT EMITTING LAYER 30nm 2% |
| HOLE TRANSPORT LAYER 65nm |
| CHARGE GENERATING LAYER 11nm |
| ELECTRON TRANSPORT LAYER 18nm |
| BLUE LIGHT EMITTING LAYER 25nm 5% |
| HOLE TRANSPORT LAYER 40nm |
| CHARGE GENERATING LAYER 11nm |
| ELECTRON TRANSPORT LAYER 8nm |
| GREEN LIGHT EMITTING LAYER 35nm 15% |
| HOLE TRANSPORT LAYER 90nm |
| ANODE 100nm |
| GLASS SUBSTRATE 0.7mm |

ORGANIC ELECTROLUMINESCENT DEVICE AND ILLUMINATION DEVICE

TECHNICAL FIELD

The present invention relates to an organic electroluminescent device and to a illumination device including the same.

The present application claims the benefit of priority of Japanese Patent Application No. 2017-23309 filed on Feb. 10, 2017, the contents of which are incorporated herein by reference.

BACKGROUND ART

An organic electroluminescent element (hereafter, also referred to as "organic EL element" for short) is a self-luminescent element including a light emitting layer, made of an organic compound, between a cathode and an anode facing each other. When voltage is applied between the cathode and the anode, electrons injected into the light emitting layer from the cathode side and holes injected into the light emitting layer from the anode side recombine in the light emitting layer to form excitons and the excitons causes the organic EL element to emit light.

As an organic EL element capable of achieving high luminance and longlife, there is known an element with a multi-photon emission structure (hereafter, referred to as "MPE element" for short) in which a light emitting unit including at least one light emitting layer is considered as one unit and an electrically-insulating charge generating layer is arranged between multiple light emitting units (for example, see Patent Document 1). In the MPE element, when voltage is applied between a cathode and an anode, charges in a charge transfer complex move to the cathode side and the anode side. In the MPE element, holes are thereby injected into one light emitting unit located on the cathode side of the charge generating layer and electrons are injected into another light emitting unit located on the anode side of the charge generating layer. In such an MPE element, since light can be simultaneously emitted from the multiple light emitting units with the same current amount, a current efficiency and an external quantum efficiency multiplied by the number of the light emitting units can be achieved.

However, when light is to be extracted to the outside through a substrate in the MPE element, it is difficult to appropriately control the distribution characteristics of light emitted from the element into the substrate and the technology has not yet reached the level where the light can be sufficiently extracted to the outside. Since the MPE element is formed of multiple light emitting units, there are many layers forming the element. Accordingly, the MPE element has a problem that it is difficult to individually control the optical characteristics of the respective layers and a suitable optical design for optimizing the distribution characteristics of light emitted from the element into the substrate is not achieved.

PRIOR ART DOCUMENT

Patent Document

Patent Document 1: Japanese Patent Application Publication No. 2003-272860

SUMMARY OF THE INVENTION

Problems to be Solved by the Invention

The present invention has been proposed in view of the aforementioned conventional circumstances and an object thereof is to provide an organic electroluminescent device which can provide white light with a high luminous efficiency by being optimized in total luminous flux and is thus suitable for a lighting device and also provide a lighting device including this organic electroluminescent device.

Means for Solving the Problems

To achieve the above object, provided are the following aspects.

(1) An organic electroluminescent device having a structure in which a plurality of light emitting units each including a light emitting layer made of at least an organic compound are stacked one on top of another between a first electrode and a second electrode with a charge generating layer sandwiched between each pair of the adjacent light emitting units, the organic electroluminescent device capable of providing white light through a substrate adjacent to the first electrode or the second electrode by causing the plurality of light emitting units to emit light, wherein the white light produced by light emission of the plurality of light emitting units is formed of red light, green light, and blue light, distribution characteristics of light emitted into the substrate are such that a luminance of the white light takes a maximum in an angle range of 20 to 60 degrees with respect to an axis perpendicular to a plane direction of the substrate, and a spectral radiance at a maximum emission wavelength of the red light and a spectral radiance at a maximum emission wavelength of the green light each take a maximum in an angle range of 30 to 70 degrees with respect to the axis perpendicular to the plane direction of the substrate and the maxima are higher than a value of the spectral radiance in an axial direction perpendicular to the plane direction of the substrate at the maximum emission wavelength of the red light and a value of the spectral radiance in the axial direction perpendicular to the plane direction of the substrate at the maximum emission wavelength of the green light, respectively.

(2) The organic electroluminescent device according to the above aspect (1), wherein the distribution characteristics of light emitted into the substrate are such that, when: an angle at which the luminance of the white light is maximum is (A); an angle at which the spectral radiance at the maximum emission wavelength of the red light is maximum is (B); and an angle at which the spectral radiance at the maximum emission wavelength of the green light is maximum is (C) with the axis perpendicular to the plane direction of the substrate being a reference, the angle (A), the angle (B), and the angle (C) satisfy a relationship of $(C) \geq (A) \geq (B)$.

(3) The organic electroluminescent device according to the above aspect (1) or (2), wherein the distribution characteristics of light emitted into the substrate are such that, when the maximum of the spectral radiance at the maximum emission wavelength of the red light or the green light is (D) and the value of the spectral radiance in the axial direction perpendicular to the plane direction of the substrate at the maximum emission wavelength of the red light or the green light is (E), a ratio of the value (E) to the maximum (D) ((E)/(D)) is 0.7 or smaller.

(4) The organic electroluminescent device according to any one of the above aspects (1) to (3), the organic electroluminescent device having the structure in which the plurality of light emitting units each including the light emitting layer made of at least the organic compound are stacked one on top of another between the first electrode and the second electrode with the charge generating layer sandwiched between each pair of the adjacent light emitting units, the organic electroluminescent device capable of providing the white light through the substrate adjacent to the first electrode or the second electrode by causing the plurality of light emitting units to emit light, comprising:
a first light emitting unit formed of a red light emitting unit including a red light emitting layer which emits the red light;
a second light emitting unit formed of a blue light emitting unit including a blue light emitting layer which emits the blue light; and
a third light emitting unit formed of a green light emitting unit including a green light emitting layer which emits the green light, wherein
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween, and
the organic electroluminescent device has a structure in which the second electrode, the third light emitting unit, the second charge generating layer, the second light emitting unit, the first charge generating layer, the first light emitting unit, and the first electrode are stacked one on top of another in this order.

(5) The organic electroluminescent device according to any one of the above aspects (1) to (4), wherein
the charge generating layer is formed of an electrically insulating layer made of an electron accepting material and an electron donating material, and
a specific resistance of the electrically insulating layer is $1.0 \times 10^2$ Ω·cm or more.

(6) The organic electroluminescent device according to the above aspect (5), wherein the specific resistance of the electrically insulating layer is $1.0 \times 10^5$ Ω·cm or more.

(7) The organic electroluminescent device according to any one of the above aspects (1) to (4), characterized in that
each of the charge generating layers is formed of a mixed layer of different materials and one component of the mixed layer forms a charge transfer complex by redox, and
when voltage is applied between the first electrode and the second electrode, charges in the charge transfer complex move to the first electrode side and the second electrode side to cause holes to be injected into one light emitting unit located on the first electrode side of the charge generating layer and cause electrons to be injected into another light emitting unit located on the second electrode side of the charge generating layer.

(8) The organic electroluminescent device according to any one of the above aspects (1) to (4), characterized in that
each of the charge generating layers is formed of a laminate of an electron accepting material and an electron donating material, and
when voltage is applied between the first electrode and the second electrode, in an interface between the electron accepting material and the electron donating material, charges generated by reaction involving electron transfer between the electron accepting material and the electron donating material move to the first electrode side and the second electrode side to cause holes to be injected into one light emitting unit located on the first electrode side of the charge generating layer and cause electrons to be injected into another light emitting unit located on the second electrode side of the charge generating layer.

(9) The organic electroluminescent device according to any one of the above aspects (1) to (8), characterized in that the charge generating layers contain a compound having a structure expressed by formula (1):

[Chem. 1]

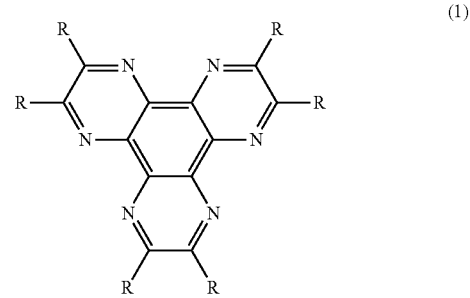

(1)

where R represents an electron withdrawing group of F, Cl, Br, I, CN, or $CF_3$.

(10) The organic electroluminescent device according to anyone of the above aspects (1) to (9), wherein the first electrode is made of silver.

(11) A lighting device comprising the organic electroluminescent device according to any one of the above aspects (1) to (10).

(12) The lighting device according to the above aspect (11), comprising an optical film on a light extraction surface side of the organic electroluminescent device.

(13) The lighting device according to the above aspect (11) or (12), wherein an average color rendering index (Ra) of the white light is 80 or more.

(14) The lighting device according to any one of the above aspects (11) to (13), wherein
the substrate is a base substrate or a sealing substrate,
the base substrate or the sealing substrate is formed of a flexible substrate, and
the lighting device is flexible.

Effect of the Invention

According to the one aspect described above, it is possible to provide an organic electroluminescent device which can provide white light with a high luminous efficiency by being optimized in total luminous flux and is thus suitable for a lighting device and also provide a lighting device including this organic electroluminescent device.

FIG. 3 is a cross-sectional view illustrating a schematic structure of an organic EL device of Example 1.

FIG. 6 is a cross-sectional view illustrating a schematic structure of an organic EL device of Example 2.

FIG. 9 is a cross-sectional view illustrating a schematic structure of an organic EL device of Example 3.

MODE FOR CARRYING OUT THE INVENTION

Figure 1:
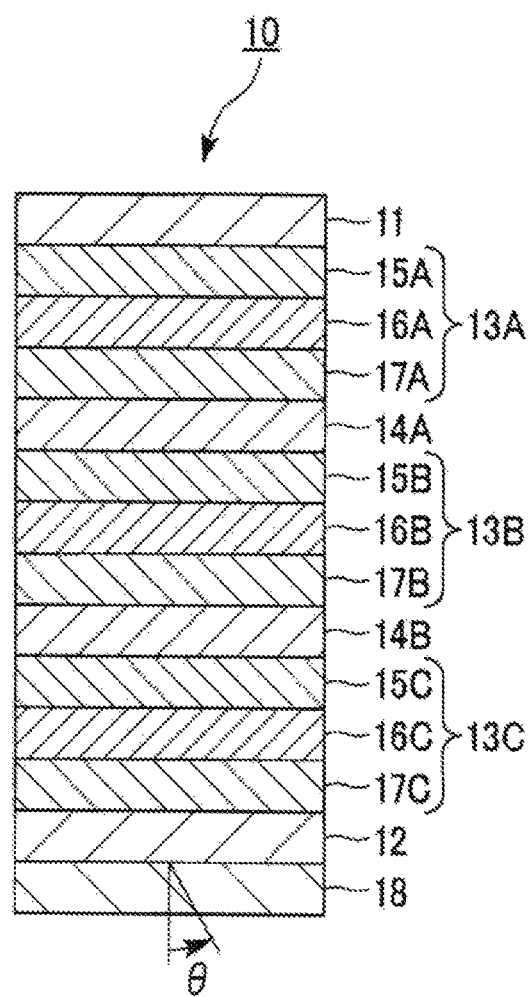
FIG. 1 is a cross-sectional view illustrating a schematic configuration of an organic EL device according to a first embodiment of the present invention.

Detailed description is given of embodiments of an organic electroluminescent device of the present invention and a lighting device including the same with reference to the drawings.

Note that, for the sake of convenience, in the drawings used in the following description, characteristic parts are sometimes illustrated in an enlarged manner to facilitate understanding of characteristics, and proportions of dimensions of constitutional elements and the like are not always the same as actual ones. Moreover, materials, dimensions, and the like exemplified in the following description are merely examples and the present invention are not necessarily limited to those and can be carried out with the materials, dimensions, and the like appropriately changed within a scope not changing the spirit of the invention.

First Embodiment

"Organic Electroluminescent Device (Organic EL Device)"

FIG. 1 is a cross-sectional view illustrating a schematic configuration of an organic EL device according to a first embodiment of the present invention.

As illustrated in FIG. 1, the organic EL device 10 of the embodiment has a structure in which multiple light emitting units 13A, 13B, 13C each including a light emitting layer made of at least an organic compound are stacked one on top of another between a first electrode 11 and a second electrode 12 with each of charge generating layers (CGL) 14A, 14B sandwiched between the corresponding pair of the adjacent light emitting units 13A, 13B, 13C. The organic EL device 10 is an organic EL device capable of providing white light through a substrate 18 adjacent to the second electrode 12 by causing the multiple light emitting units 13A, 13B, 13C to emit light.

Note that the organic EL device 10 of the embodiment may be an organic EL device capable of providing white light through a substrate adjacent to the first electrode 11.

The first light emitting unit 13A is a red light emitting unit. The red light emitting unit includes a first light emitting layer 16A formed of a red light emitting layer which emits red light with one maximum emission wavelengths in a red wavelength band. The red light emitting layer may be a red fluorescent light emitting layer containing a red fluorescent material or a red phosphorescent light emitting layer containing a red phosphorescent material. The red light provided by the red light emitting unit including the red fluorescent light emitting layer may include a delayed fluorescence component.

The second light emitting unit 13B is a blue light emitting unit. The blue light emitting unit includes a second light emitting layer 16B formed of a blue light emitting layer which emits blue light with one or two maximum emission wavelengths in a blue wavelength band. The blue light emitting layer may be a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The third light emitting unit 13C is a green light emitting unit. The green light emitting unit includes a third light emitting layer 16C formed of a green light emitting layer which emits green light with one or two maximum emission wavelengths in a green wavelength band. The green light emitting layer may be a green fluorescent light emitting layer containing a green fluorescent material or a green phosphorescent light emitting layer containing a green phosphorescent material. The green light provided by the green light emitting unit including the green fluorescent light emitting layer may include a delayed fluorescence component.

The white light provided by the organic EL device 10 of the embodiment is formed of the red light emitted from the red light emitting layer in the red light emitting unit, the green light emitted from the green light emitting layer in the green light emitting unit, and the blue light emitted from the blue light emitting layer in the blue light emitting unit.

The first light emitting unit 13A and the second light emitting unit 13B are stacked one on top of the other with the first charge generating layer 14A sandwiched therebetween.

The second light emitting unit 13B and the third light emitting unit 13C are stacked one on top of the other with the second charge generating layer 14B sandwiched therebetween.

The organic EL device 10 of the embodiment has a structure in which the substrate 18, the second electrode 12, the third light emitting unit 13C, the second charge generating layer 14B, the second light emitting unit 13B, the first charge generating layer 14A, the first light emitting unit 13A, and the first electrode 11 are stacked one on top of another in this order. Specifically, the organic EL device 10 of the embodiment has an MPE structure in which the first light emitting unit 13A, the second light emitting unit 13B, and the third light emitting unit 13C are stacked one on top of another with each of the first charge generating layer 14A and the charge generating layer 14B sandwiched between the corresponding pair of the adjacent light emitting units 13A, 13B, 13C.

In the organic EL device 10 of the embodiment, the white light produced by light emission of the first light emitting unit 13A, the second light emitting unit 13B, and the third light emitting unit 13C has an emission spectrum continuous over a wavelength band of at least 380 nm to 780 nm.

Distribution characteristics of light emitted into the substrate 18 are such that the luminance of the white light takes the maximum in an angle range of 20 to 60 degrees with respect to an axis perpendicular to a plane direction of the substrate 18.

The luminance of the white light taking the maximum in a range below 20 degrees with respect to the axis perpendicular to the plane direction of the substrate 18 means that light emission components are condensed toward the front of the substrate 18. The light emission components condensed toward the front of the substrate 18 is normally emitted toward a surface of the substrate 18 in a state where there is no optical film such as a light extraction film. However, when there is an optical film on the surface (that is, an outer surface, a surface on the opposite side to the surface located on the second electrode 12 side) of the substrate 18, some light emission components return into the substrate 18 by mirror reflection, refraction, and the like on an optical film interface. In such a case, in the organic EL device, the optical film cannot sufficiently provide an effect of improving the efficiency. Meanwhile, the luminance of the white light taking the maximum in a range above 60 degrees with respect to the axis perpendicular to the plane direction of the substrate 18 means that the light emission components are spreading in wide-angle directions with respect to the axis perpendicular to the plane direction of the substrate 18. In this case, light spreads at a very shallow angle with respect to the plane of the substrate 18. In such a case, in the organic EL device, the light emission components cannot be efficiently extracted even if an optical film is used. Accordingly, a high total luminous flux value cannot be obtained.

Moreover, the organic EL device 10 of the embodiment has one maximum wavelength in a red wavelength band of 590 nm to 640 nm, one or two maximum emission wavelengths in a blue wavelength band of 440 nm to 490 nm, and one or two maximum emission wavelengths in a green wavelength band of 500 nm to 560 nm in the emission spectrum of the white light. These maximum emission wavelengths are based on the maximum emission wavelengths of the red light emitted from the red light emitting layer (first light emitting layer 16A) in the first light emitting unit 13A, the blue light emitted from the blue light emitting layer (second light emitting layer 16B) in the second light emitting unit 13B, and the green light emitted from the green light emitting layer (third light emitting layer 16C) in the third light emitting unit 13C.

The light emission intensity at the maximum emission wavelength of the red light is higher than either of the light emission intensity at the maximum emission wavelength of the blue light and the light emission intensity at the maximum emission wavelength of the green light. The white light provided by the organic EL device 10 of the embodiment thereby has low color temperature and has a warm color. Moreover, it is possible to improve the light emission efficiency while maintaining the warm color by setting the light emission intensity at the maximum emission wavelength of the green light higher than the light emission intensity at the maximum emission wavelength of the blue light.

Accordingly, in the organic EL device 10 of the embodiment, the light emission intensity at the maximum emission wavelength of the red light and the light emission intensity at the maximum emission wavelength of the green light are important in obtaining suitable light emission characteristics.

In the organic EL device 10 of the embodiment, the distribution characteristics of light emitted into the substrate 18 are such that the spectral radiance at the maximum emission wavelength of the red light and the spectral radiance at the maximum emission wavelength of the green light each take the maximum in an angle range of 30 to 70 degrees with respect to the axis perpendicular to the plane direction of the substrate 18. The maxima are higher than the value of the spectral radiance in an axial direction perpendicular to the plane direction of the substrate 18 at the maximum emission wavelength of the red light and the value of the spectral radiance in the axial direction perpendicular to the plane direction of the substrate 18 at the maximum emission wavelength of the green light, respectively.

When at least one of the spectral radiance at the maximum emission wavelength of the red light and the spectral radiance at the maximum emission wavelength of the green light takes the maximum in a range below 30 degrees with respect to the axis perpendicular to the plane direction of the substrate 18, the proportion of the red light or the green light extracted in the axial direction perpendicular to the plane direction of the substrate 18 increases. Meanwhile, when at least one of the spectral radiance at the maximum emission wavelength of the red light and the spectral radiance at the maximum emission wavelength of the green light takes the maximum in a range above 70 degrees with respect to the axis perpendicular to the plane direction of the substrate 18, the proportion of the red light or the green light extracted in the wide angle directions with respect to the axis perpendicular to the plane direction of the substrate 18 increases.

Since the color light viewed at a certain angle cannot be guaranteed to be white light in both cases, both cases lead to a decrease in the color rendering property and a poor angular dependency of the color light. In addition, since the red light and green light whose degrees of contribution to characteristic values of the white light are high cannot be efficiently extracted to the outside of the substrate 18, a high total luminous flux value cannot be achieved.

A glass substrate or a plastic substrate can be used as the substrate 18.

For example, soda-lime glass, non-alkali glass, borosilicate glass, silicate glass, or the like can be used for the glass substrate.

For example, polyethylene terephthalate (PET), polyethylene naphthalate (PEN), polyimide (PI), or the like can be used for the plastic substrate.

Generally, a metal with a small work function, an alloy of such a metal, a metal oxide, or the like is preferably used as the first electrode 11. For example, as a metal forming the first electrode 11, it is possible to use a metal single substance like an alkaline metal such as lithium (Li), an alkaline earth metal such as magnesium (Mg) or calcium (Ca), or a rare-earth metal such as europium (Eu) or use an alloy containing any of these metals and aluminum (Al), silver (Ag), indium (In), or the like.

Alternatively, the first electrode 11 may have a configuration in which an organic layer doped with a metal is used in an interface between the first electrode 11 and an organic layer as described in, for example, "Japanese Patent Application Publication No. Hei 10-270171" and "Japanese Patent Application Publication No. 2001-102175." In this case, it is only necessary to use an electrically conductive material as the material of the first electrode 11 and the material is not limited to one with particular properties such as the work function.

As another alternative, the first electrode 11 may have a configuration in which an organic layer in contact with the first electrode 11 is made of an organic metal complex compound containing at least one type selected from the group consisting of alkali metal ions, alkaline earth metal ions, and rare-earth metal ions as described in, for example, "Japanese Patent Application Publication No. Hei 11-233262" and "Japanese Patent Application Publication No. 2000-182774." In this case, a metal capable of reducing the metal ions contained in the organic metal complex compound to metal in vacuum, for example, a metal (with a thermal reduction property) such as aluminum (Al), zirconium (Zr), titanium (Ti), and silicon (Si) or an alloy containing any of these metals can be used as the first electrode 11. Among these, Al which is generally widely used as a wiring electrode is particularly preferable from the viewpoint of ease of vapor deposition, high light reflectance, chemical stability, and the like.

The material of the second electrode 12 is not limited to a particular material. When light is to be extracted from the second electrode 12 side, a transparent, electrically conductive material such as, for example, ITO (Indium Tin Oxide) or IZO (Indium Zinc Oxide) can be used.

Moreover, in contrary to a general organic EL element, light can be extracted from the first electrode 11 side by using a metal material or the like for the second electrode 12 and using a transparent, electrically conductive material for the first electrode 11. For example, by employing the method described in "Japanese Patent Application Publication No. 2002-332567," the first electrode 11 made of the aforementioned transparent, electrically conductive material such as ITO and IZO can be formed by sputtering which does not damage an organic film.

Accordingly, when both of the first electrode 11 and the second electrode 12 are formed to be transparent, since the first light emitting unit 13A, the second light emitting unit 13B, the third light emitting unit 13C, the first charge generating layer 14A, and the second charge generating layer 14B are also similarly transparent, it is possible to manufacture a transparent organic EL device 10.

Note that the order of film formation does not have to start from the second electrode 12 side and may start from the first electrode 11 side.

The first light emitting unit 13A is formed of a first electron transport layer 15A, a first light emitting layer 16A, and a first hole transport layer 17A. The second light emitting unit 13B is formed of a second electron transport layer 15B, a second light emitting layer 16B, and a second hole transport layer 17B. The third light emitting unit 13C is formed of a third electron transport layer 15C, a third light emitting layer 16C, and a third hole transport layer 17C.

The first light emitting unit 13A, the second light emitting unit 13B, and the third light emitting unit 13C may employ any of various structures similar to those of conventionally-known organic EL elements and may have any laminated structure as long as they include light emitting layers made of at least an organic compound. For example, each of the first light emitting unit 13A, the second light emitting unit 13B, and the third light emitting unit 13C may be configured such that an electron injection layer, a hole blocking layer, and the like are arranged on the first electrode 11 side of the light emitting layer and a hole injection layer, an electron blocking layer, and the like are arranged on the second electrode 12 side of the light emitting layer.

The first electron transport layer 15A, the second electron transport layer 15B, and the third electron transport layer 15C are made of, for example, a conventionally well-known electron transport material. In the organic EL device 10 of the embodiment, an electron transport material with a relatively deep HOMO (Highest Occupied Molecular Orbital) level is preferably used among electron transport materials generally used for organic EL elements. Specifically, an electron transport material with a HOMO level of at least about 6.0 eV is preferably used. For example, 4,7-Diphenyl-1,10-phenanthroline (Bphen), 2,2',2"-(1,3,5-Benzinetriyl)-tris(1-phenyl-1-H-benzimidazole) (TPBi), and the like can be used as such an electron transport material.

Moreover, the first electron transport layer 15A, the second electron transport layer 15B, and the third electron transport layer 15C may each be formed of a single layer or two or more layers.

At least one electron injection layer is provided between the first electrode 11 and the first electron transport layer 15A, between the first charge generating layer 14A and the second electron transport layer 15B, or between the second charge generating layer 14B and the third electron transport layer 15C to improve injection efficiency of electrons from at least one of the first electrode 11, the first charge generating layer 14A, and the second charge generating layer 14B. An electron transport material having properties similar to the electron transport layers can be used as the material of the electron injection layers. The electron transport layers and the electron injection layers are sometimes collectively referred to as electron transport layers.

The first hole transport layer 17A, the second hole transport layer 17B, and the third hole transport layer 17C are made of, for example, a conventionally well-known hole transport material. The hole transport material is not limited to a particular material. For example, an organic compound (electron donating material) which has an ionization potential less than 5.7 eV and which has a hole transport property, that is an electron donating property is preferably used as the hole transport material. For example, an arylamine compound such as 4,4'-bis-[N-(2-naphthyl)-N-phenyl-amino]biphenyl (α-NPD) or the like can be used as the electron donating material.

At least one hole injection layer is provided between the second electrode 12 and the third hole transport layer 17C, between the second charge generating layer 14B and the second hole transport layer 17B, or between the first charge generating layer 14A and the first hole transport layer 17A to improve injection efficiency of holes from at least one of the second electrode 12, the second charge generating layer 14B, and the first charge generating layer 14A. An electron donating material having properties similar to the hole transport layers can be used as the material of the hole injection layers. The hole transport layer and the hole injection layer are sometimes collectively referred to as a hole transport layer.

The first light emitting layer 16A included in the first light emitting unit 13A is formed of a red fluorescent light emitting layer containing a red fluorescent material or a red phosphorescent light emitting layer containing a red phosphorescent material.

The red fluorescent light emitting layer or the red phosphorescent light emitting layer contains a host material which is a main component and a guest material which is a minor component as the organic compound. Emission of the red light is attributable particularly to the properties of the guest material.

As the host material of the first light emitting layer 16A included in the first light emitting unit 13A, a material with an electron transport property, a material with a hole transport property, a material obtained by mixing these materials, or the like can be used. As the host material of the red phosphorescent light emitting layer, for example, a material such as 4,4'-biscarbazolylbiphenyl (CBP) or 2,9-dimethyl-4,7-diphenyl-9,10-phenanthroline (BCP) can be used. As the host material of the red fluorescent light emitting layer, for example, a material such as 4,4'-bis(2,2-diphenylvinyl)-1,1'-biphenyl (DPVBi) or tris(8-hydroxyquinolinato)aluminum (Alga) can be used.

The guest material of the first light emitting layer 16A included in the first light emitting unit 13A is also referred to as dopant material. The guest material utilizing fluorescent light emission is generally referred to as fluorescent light emitting material. A light emitting layer made of the fluorescent light emitting material is referred to as fluorescent light emitting layer. Meanwhile, the guest material utilizing phosphorescent light emission is generally referred to as phosphorescent light emitting material. A light emitting layer made of the phosphorescent light emitting material is referred to as phosphorescent light emitting layer.

In the phosphorescent light emitting layer out of these layers, it is possible to utilize not only 75% of triplet excitons, which are generated by recombination of electrons and holes, but also 25% of the triplet excitons, which are generated by energy transfer from singlet excitons. Accordingly, an internal quantum efficiency of 100% can be achieved in theory. Specifically, the excitons generated by the recombination of electrons and holes are converted to light in the light emitting layer without thermal quenching or the like. In an organic metal complex including heavy atoms such as iridium or platinum, an internal quantum efficiency close to 100% is actually achieved by optimization of the element structure and the like.

As the guest material of the red phosphorescent light emitting layer, a red phosphorescent light emitting material such as $Ir(piq)_3$ or $Ir(btpy)_3$ can be used.

As the guest material of the red fluorescent light emitting layer, a material such as DCJTB can be used.

The blue light emitting layer included in the second light emitting unit 13B is formed of a blue fluorescent light emitting layer containing a blue fluorescent material or a blue phosphorescent light emitting layer containing a blue phosphorescent material. The blue light emitting layer contains a host material which is a main component and a guest material which is a minor component as the organic compound. The blue fluorescent material or the blue phosphorescent material corresponds to the guest material out of these materials. In either case, emission of the blue light is attributable particularly to the properties of the guest material.

As the host material of the blue light emitting layer included in the second light emitting unit 13B, a material with an electron transport property, a material with a hole transport property, a material obtained by mixing these materials, or the like can be used. In the blue fluorescent light emitting layer, for example, a material such as a styryl derivative, an anthracene compound, a pyrene compound can be used. In the blue phosphorescent light emitting layer, for example, a material such as 4,4'-biscarbazolylbiphenyl (CBP) or 2,9-dimethyl-4,7-diphenyl-9,10-phenanthroline (BCP) can be used.

As the guest material of the blue light emitting layer included in the second light emitting unit 13B, in the blue fluorescent light emitting layer, for example, a material such as a styrylamine compound, a fluoranthene compound, an aminopyrene compound, a boron complex can be used. Moreover, a material such as 4,4'-bis[4-(diphenylamino)styryl]biphenyl (BDAVBi) or 2,7-bis{2-[phenyl(m-tolyl)amino]-9,9-dimethyl-fluoren-7-yl}-9,9-dimethyl-fluorene (MDP3FL) can be used. Meanwhile, in the blue phosphorescent light emitting layer, for example, a blue phosphorescent light emitting material such as $Ir(Fppy)_3$ can be used.

The green light emitting layer included in the third light emitting unit 13C is formed of a green fluorescent light emitting layer containing a green fluorescent material or a green phosphorescent light emitting layer containing a green phosphorescent material. The green light emitting layer contains a host material which is a main component and a guest material which is a minor component as the organic compound. The green fluorescent material or the green phosphorescent material corresponds to the guest material out of these materials. In either case, emission of the green light is attributable particularly to the properties of the guest material.

As the host material of the green light emitting layer included in the third light emitting unit 13C, a material with an electron transport property, a material with a hole transport property, a material obtained by mixing these materials, or the like can be used. In the green fluorescent light emitting layer, a material such as 4,4'-bis(2,2-diphenylvinyl)-1,1'-biphenyl (DPVBi) or tris(8-hydroxyquinolinato)aluminum ($Alq_3$) can be used. In the green phosphorescent light emitting layer, for example, a material such as 4,4'-biscarbazolylbiphenyl (CBP) or 2,9-dimethyl-4,7-diphenyl-9,10-phenanthroline (BCP) can be used.

As the guest material of the green light emitting layer included in the third light emitting unit 13C, in the green fluorescent light emitting layer, for example, a material such as coumarin 6 can be used. In the green phosphorescent light emitting layer, for example, a green phosphorescent light emitting material such as $Ir(ppy)_3$ can be used.

For example, a vacuum deposition method, a spin coating method, or the like can be used as a film forming method of the layers forming the first light emitting unit 13A, the second light emitting unit 13B, and the third light emitting unit 13C.

The first charge generating layer 14A and the second charge generating layer 14B are each formed of an electrically insulating layer made of an electron accepting material and an electron donating material. The specific resistance of the electrically insulating layer is preferably $1.0 \times 10^2$ Ω·cm or more, more preferably $1.0 \times 10^5$ Ω·cm or more.

Alternatively, the first charge generating layer 14A and the second charge generating layer 14B each may be configured such that the charge generating layer is formed of a mixed layer of different materials and one component of the mixed layer forms a charge transfer complex by redox. In this case, when voltage is applied between the first electrode 11 and the second electrode 12, charges in the charge transfer complex move to the first electrode 11 side and the second electrode 12 side. In the organic EL device 10, holes are thereby injected into the second light emitting unit 13B located on the first electrode 11 side of the second charge generating layer 14B and the first light emitting unit 13A located on the first electrode 11 side of the first charge generating layer 14A. Moreover, in the organic EL device 10, electrons are injected into the third light emitting unit 13C located on the second electrode 12 side of the second charge generating layer 14B and the second light emitting unit 13B located on the second electrode 12 side of the first charge generating layer 14A. Light can be thereby simultaneously emitted from the first light emitting unit 13A, the second light emitting unit 13B, and the third light emitting unit 13C with the same current amount. Accordingly, a current efficiency and an external quantum efficiency proportionate to the sum of luminous efficiencies of the first light emitting unit 13A, the second light emitting unit 13B, and the third light emitting unit 13C can be obtained.

Alternatively, the first charge generating layer 14A and the second charge generating layer 14B each may be a laminate of an electron accepting material and an electron donating material. In this case, when voltage is applied between the first electrode 11 and the second electrode 12, in an interface between the electron accepting material and the electron donating material, charges generated by reaction involving electron transfer between these electron accepting material and electron donating material move to the first electrode 11 side and the second electrode 12 side. In the organic EL device 10, holes are thereby injected into the second light emitting unit 13B located on the first electrode 11 side of the second charge generating layer 14B and the first light emitting unit 13A located on the first electrode 11 side of the first charge generating layer 14A. Moreover, in the organic EL device 10, electrons are injected into the third light emitting unit 13C located on the second electrode 12 side of the second charge generating layer 14B and the second light emitting unit 13B located on the second electrode 12 side of the first charge generating layer 14A. Light can be thereby simultaneously emitted from the first light emitting unit 13A, the second light emitting unit 13B, and the third light emitting unit 13C with the same current amount. Accordingly, a current efficiency and an external quantum efficiency proportionate to the sum of luminous efficiencies of the first light emitting unit 13A, the second light emitting unit 13B, and the third light emitting unit 13C can be obtained.

For example, materials described in Japanese Patent Application Publication No. 2003-272860 can be used as materials forming the first charge generating layer 14A and the second charge generating layer 14B. Among these, materials described in paragraphs [0019] to [0021] can be preferably used. Alternatively, materials described in paragraphs [0023] to of "International Patent Application Publication No. WO2010/113493" can be used as materials forming the first charge generating layer 14A and the second charge generating layer 14B. Among these, a strong electron accepting material (HATCN6) described in paragraphs [0059] in particular can be preferably used. When substituent groups represented by R in the structure expressed by the following formula (1) are CN (cyano groups), this compound is HATCN6 described above.

[Chem. 2]

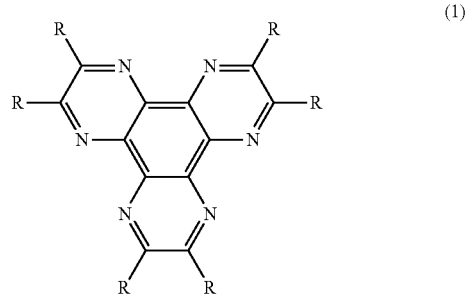

(1)

where R represents an electron withdrawing group of F, Cl, Br, I, CN, or $CF_3$.

As described above, in the organic EL device 10 of the embodiment, the distribution characteristics of light emitted into the substrate 18 is such that the luminance of the white light takes the maximum in the angle range of 20 to 60 degrees with respect to the axis perpendicular to the plane direction of the substrate 18. Moreover, in the organic EL device 10 of the embodiment, the spectral radiance at the maximum emission wavelength of the red light and the spectral radiance at the maximum emission wavelength of the green light each take the maximum in the angle range of 30 to 70 degrees with respect to the axis perpendicular to the plane direction of the substrate 18 and the maxima are higher than the value of the spectral radiance in the axial direction perpendicular to the plane direction of the substrate 18 at the maximum emission wavelength of the red light and the value of the spectral radiance in the axial direction perpendicular to the plane direction of the substrate 18 at the maximum emission wavelength of the green light. Accordingly, it is possible to optimize the total luminous flux and provide white light with a high luminous efficiency.

Moreover, in the organic EL device 10 of the embodiment, the distribution characteristics of light emitted into the substrate 18 is preferably such that, when: an angle at which the luminance of the white light is maximum is (A); an angle at which the spectral radiance at the maximum emission wavelength of the red light is maximum is (B); and an angle at which the spectral radiance at the maximum emission wavelength of the green light is maximum is (C) with the axis perpendicular to the plane direction of the substrate 18 being the reference, the angle (A), the angle (B), and the angle (C) satisfy a relationship of (C)≥(A)≥(B).

This can further optimize the total luminous flux and provide white light with a higher luminous efficiency.

Furthermore, in the organic EL device 10 of the embodiment, the distribution characteristics of light emitted into the substrate 18 are preferably such that, when the maximum of the spectral radiance at the maximum emission wavelength of the red light or the green light is (D) and the value of the spectral radiance in the axial direction perpendicular to the plane direction of the substrate 18 at the maximum emission wavelength of the red light or the green light is (E), a ratio of the value (E) to the maximum (D) ((E)/(D)) is 0.7 or smaller. More preferably, the ratio of the value (E) to the maximum (D) ((E)/(D)) is 0.6 or smaller.

When the ratio of the value (E) to the maximum (D) ((E)/(D)) is 0.7 or less, it is possible to optimize the total luminous flux and provide white light with a higher luminous efficiency.

As described above, the organic EL device 10 of the embodiment can provide white light with a high luminous efficiency. Moreover, the organic EL device 10 of the embodiment has the MPE structure in which the first light emitting unit 13A, the second light emitting unit 13B, and the third light emitting unit 13C are stacked one on top of the other with each of the first charge generating layer 14A and the second charge generating layer 14B sandwiched between the corresponding pair of adjacent light emitting units. Accordingly, the organic EL device 10 can provide the white light while achieving high-luminance light emission and long-life driving.

The organic EL device 10 of the embodiment can be thus preferably used in a lighting device.

Second Embodiment

"Lighting Device"

An embodiment of the lighting device in the present invention is described.

Figure 2:
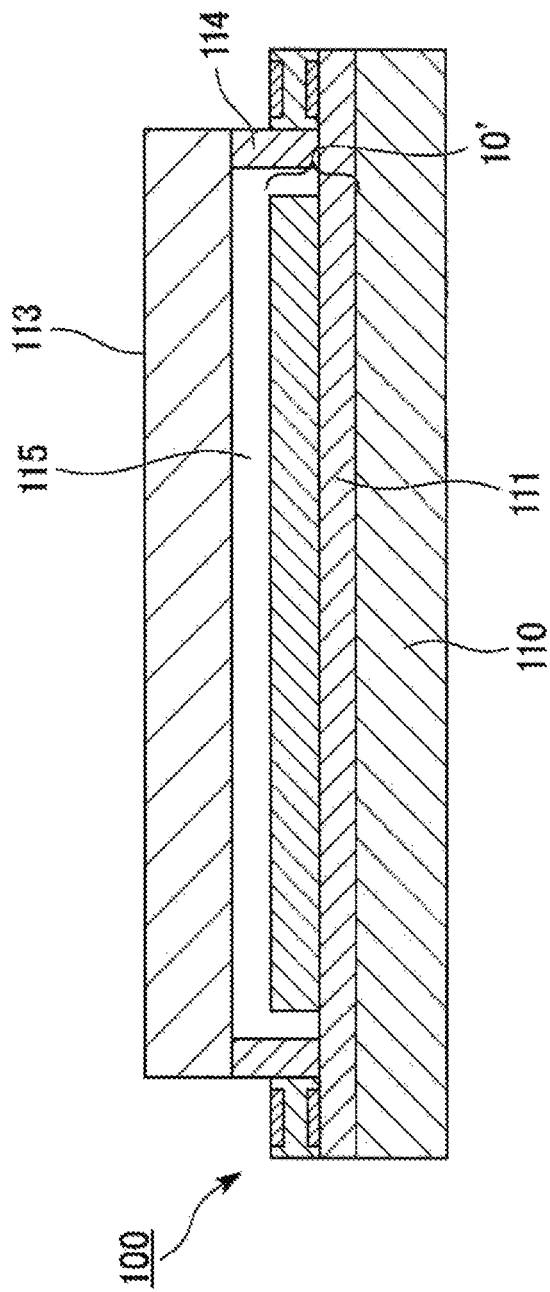
FIG. 2 is a cross-sectional view illustrating a schematic configuration of one embodiment of a lighting device in the present invention.

FIG. 2 is a cross-sectional view illustrating a configuration of one embodiment of the lighting device in the present invention. Although an example of the lighting device to which the present invention is applied is described herein, the lighting device of the present invention is not necessarily limited to such a configuration and various changes can be made as appropriate.

The lighting device 100 of the embodiment includes, for example, the organic EL device 10 in the aforementioned first embodiment as a light source. A base substrate 110 in the lighting device 100 of the embodiment corresponds to the substrate 18 in the organic EL element 10' and anode terminal electrodes 111 in the lighting device 100 corresponds to the second electrode 12 in the organic EL device 10. The organic EL device 10 includes the organic EL element 10' and the organic EL element 10' is formed of the first electrode 11, the laminate of the first light emitting unit 13A to the third light emitting unit 13C, and the second electrode 12.

As illustrated in FIG. 2, in the lighting device 100 of the embodiment, the multiple anode terminal electrodes 111 and cathode terminal electrodes (illustration omitted) are formed at sides or vertices of a periphery of the base substrate 110 so that the organic EL element 10' can uniformly emit light. The anode terminal electrodes 111 correspond to the second electrode 12 in the organic EL device 10. The entire surfaces of the anode terminal electrodes 111 and the entire surfaces of the cathode terminal electrodes are covered with solder (underlying solder) to reduce wiring resistance. Moreover, the anode terminal electrodes 111 and the cathode terminal electrodes uniformly supply an electric current to the organic EL element 10' from the sides or vertices of the periphery of the base substrate 110. For example, in order to uniformly supply an electric current to the organic EL device 10 formed in a quadrilateral shape, the lighting device 100 includes the anode terminal electrodes 111 on the sides and the cathode terminal electrodes at the vertices. Alternatively, for example, the lighting device 100 includes the anode terminal electrodes 111 on peripheries of L-shaped portions each including a vertex and extending over two sides and the cathode terminal electrodes in center portions of the respective sides.

Moreover, a sealing substrate 113 is arranged on the base substrate 110 to cover the organic EL element 10' to prevent degrading of the performance of the organic EL element 10' due to oxygen, water, and the like. The sealing substrate 113 is provided on the base substrate 110 with a peripheral sealing member 114 therebetween. A small gap 115 is provided between the sealing substrate 113 and the organic EL element 10'. This gap 115 is filled with a hygroscopic agent. The gap 115 may be filled with, for example, an inert gas such as nitrogen, silicone oil, or the like instead of the hygroscopic agent. Moreover, the gap 115 may be filled with a gel resin in which the hygroscopic agent is dispersed.

Note that, although the glass substrate is used as the base substrate 110 in the embodiment, a substrate made of a material such as plastic, metal, or ceramic may also be used. Moreover, in the embodiment, a glass substrate, a plastic substrate, or the like can be used as the sealing substrate 113. When plastic substrates are used as the base substrate 110 and the sealing substrate 113, the lighting device 100 of the embodiment is flexible.

Moreover, a UV curable resin or a thermal setting resin with low oxygen permeability and low water permeability, a laser glass frit, or the like can be used for the sealing member 114.

The lighting device 100 of the embodiment may have a configuration including an optical film for improving the luminous efficiency, on the light extraction surface side.

The optical film used in the lighting device 100 of the embodiment is provided to improve the luminous efficiency and optimize the total luminous flux while maintaining the color rendering property.

In general, it is said that an organic EL device emits light in a light emitting layer with a higher refractive index (refractive index of about 1.6 to 2.1) than air and only about 15% to 20% of light emitted from the light emitting layer can be extracted. This is because light incident on an interface at an angle equal to or above a critical angle is totally reflected and cannot be extracted to the outside of the element. Specifically, light is totally reflected between a transparent substrate and a transparent electrode or the light emitting layer to be guided through the transparent electrode or the light emitting layer and resultantly escapes in directions toward side surfaces of the element.

As a method for improving the extraction efficiency of the light, there are, for example, the following methods: a method of making a surface of the transparent substrate rough to prevent total reflection on an interface between the transparent substrate and air (see, for example, "U.S. Pat. No. 4,774,435"); a method of providing the substrate with a light condensing property to improve the efficiency (see, for example, "Japanese Patent Application Publication No. Sho 63-314795"); a method of forming reflection surfaces on the side surfaces of the organic EL device and the like (see, for example, "Japanese Patent Application Publication No. Hei 1-220394"); a method of introducing a flat layer with an intermediate refractive index, between the substrate and the light emitting body to form a reflection prevention film (see, for example, "Japanese Patent Application Publication No. Sho 62-172691"); a method of introducing a flat layer with a lower refractive index than the substrate, between the substrate and the light emitting body (see, for example, "Japanese Patent Application Publication No. 2001-202827"); a method of forming a diffraction grading between any two of the substrate, the transparent electrode layer, and the light emitting layer (including between the substrate and the outside) (see, for example, "Japanese Patent Application Publication No. Hei 11-283751"); and the like.

Note that, in order to improve the color rendering property as described above, the lighting device 100 may have a structure in which a microlens array or the like is further provided on a surface of the aforementioned optical film or may be combined with a light condensing sheet. This allows the light to be condensed in a specific direction, for example, a forward direction relative to the light emitting surface, thereby improving the luminance in the specific direction. Furthermore, a light diffusion film may be used together with the light condensing sheet to control a light emission angle from the lighting device 100. For example, a light diffusion film (LIGHT-UP) manufactured by Kimoto Co., Ltd. or the like can be used as the light diffusion film.

Note that the present invention is not necessarily limited to the aforementioned embodiment and various changes can be made within a scope not departing from the spirit of the present invention.

EXAMPLES

Effects of the present invention are made clearer below by using Examples.

Note that the present invention is not limited to following Examples and changes can be made as appropriate within a scope not departing from the spirit of the invention.

Example 1

"Manufacturing of Organic EL Device"

In Example 1, an organic EL device having a schematic structure illustrated in FIG. 3 was manufactured.

Specifically, first, there was prepared a soda-lime glass substrate with a thickness of 0.7 mm on which an ITO film with a thickness of 100 nm, a width of 2 mm, and a sheet resistance of about 20 Ω/□ was formed.

Then, the substrate was subjected to ultrasonic cleaning by using neutral detergent, ion-exchanged water, acetone, and isopropyl alcohol for 5 minutes for each cleaner and then subjected to spin drying and UV/O$_3$ treatment.

Next, vapor deposition crucibles (made of tantalum or alumina) in a vacuum deposition apparatus were filled respectively with materials used to form layers illustrated in FIG. 3. Then, the substrate was set in the vacuum deposition apparatus, electric power was supplied to the vapor deposition crucibles to heat them in a reduced pressure atmosphere with a degree of vacuum of 1×10$^{-4}$ Pa or less, and each of the layers was vapor-deposited to a predetermined film thickness at a deposition rate of 0.1 nm per second.

Moreover, the cathode was vapor-deposited to a predetermined film thickness at a deposition rate of 1 nm per second.

"Evaluation of Organic EL Element"

The organic EL device of Example 1 manufactured as described above was connected to a measurement unit driver (trade name: KEITHLEY 2425, manufactured by Keithley Instruments, LLC) and power with a constant current of 3 mA/cm$^2$ was supplied to the organic EL device to cause it to emit light in an integrating sphere. Then, the emission spectrum and the luminous flux value of the organic EL device were measured by using a multichannel spectrometer (trade name: USB2000, manufactured by Ocean Optics, Inc.). Moreover, the external quantum efficiency (EQE) (%) of the organic EL device of Example 1 was calculated based on the results of this measurement.

Then, the emitted light color was evaluated based on the measurement results by using chromaticity coordinates in the CIE color system. Moreover, the emitted light color was classified into one of light source colors specified in "JIS Z 9112" based on the chromaticity coordinates. Furthermore, the deviation duv from the black body locus was derived based on the specifications of "JIS Z 8725." Moreover, the average color rendering index (Ra) of the emitted light color was derived by using the method specified in "JIS Z 8726." The results of these evaluations are collectively illustrated in FIG. 4.

Moreover, the luminance and the spectral radiance of the white light emitted from the organic EL device of Example 1 were evaluated by the following method.

<Evaluation Method of Luminance and Spectral Radiance>

In order to measure the light distribution characteristics of the luminance of the white light entering the substrate and the spectral radiances of red light and green light, a hemispherical lens was fixed to a surface of the substrate with matching liquid (refractive liquid) provided between the organic EL device and the hemispherical lens. Since the matching liquid and the hemispherical lens used herein have the same refractive index as the substrate, all light emission components entering the substrate can be extracted to the atmosphere.

The organic EL device was connected to the measurement unit driver (trade name: KEITHLEY 2425, manufactured by Keithley Instruments, LLC) and power with a constant current of 3 mA/cm$^2$ was supplied to the organic EL device to cause it to emit light. Then, a jig to which the organic EL device was fixed was rotated from 0 to 80 degrees in increments of five degrees with the organic EL device being turned on. The luminance of the organic EL device and the spectral radiance at each emission wavelength at each angle were measured by using a spectroradiometer (trade name: CS-2000, manufactured by Konica Minolta, Inc.).

Figure 5:
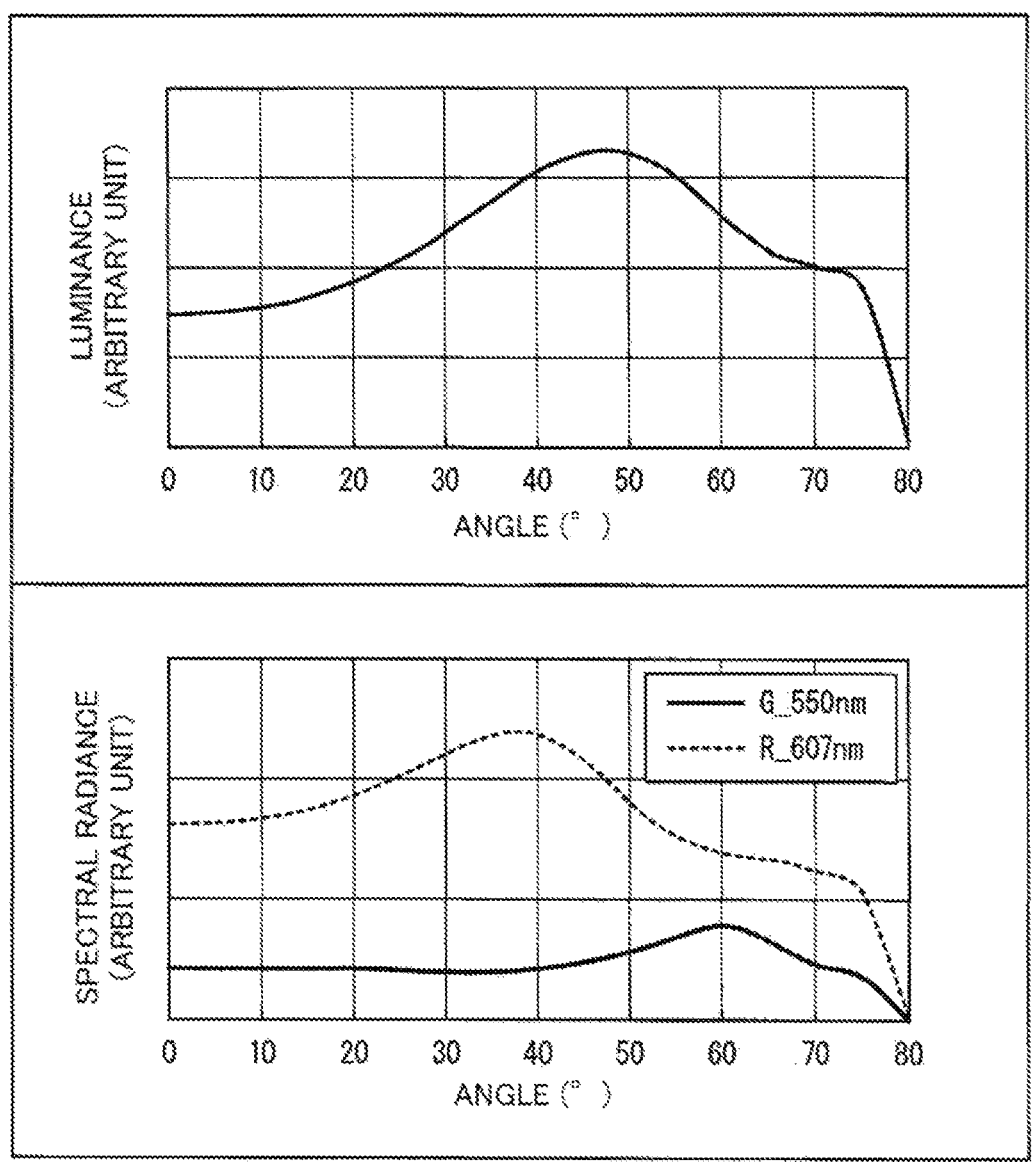
FIG. 5 is graphs illustrating distribution characteristics of light emitted into a substrate of the organic EL device of Example 1.

The results are illustrated in FIG. 5.

As illustrated in FIG. 5, it was found that, in the organic EL device of Example 1, the distribution characteristics of the light emitted into the substrate were such that the luminance of the white light took the maximum at the angle of 50 degrees as viewed in the direction of the axis perpendicular to the plane direction of the substrate. Moreover, it was found that the spectral radiance at the maximum emission wavelength of the red light (607 nm) took the maximum at 40 degrees with respect to the axis perpendicular to the plane direction of the substrate and the spectral radiance at the maximum emission wavelength of the green light (550 nm) took the maximum at 60 degrees with respect to the axis perpendicular to the plane direction of the substrate and both spectral radiances took the maxima in the angle range of 30 to 70 degrees with respect to the axis perpendicular to the plane direction of the substrate. Moreover, it was also found that, in both of the red light and the green light, the maximum of the spectral radiance at the maximum emission wavelength was higher than the value of the spectral radiance in the axial direction perpendicular to the plane direction of the substrate.

Moreover, in the organic EL device of Example 1, the distribution characteristics of the light emitted into the substrate were such that, when: the angle at which the luminance of the white light was maximum was (A); the angle at which the spectral radiance at the maximum emission wavelength of the red light was maximum was (B); and the angle at which the spectral radiance at the maximum emission wavelength of the green light was maximum was (C) with the axis perpendicular to the plane direction of the substrate being the reference, the angle (A), the angle (B), and the angle (C) satisfied the relationship of (C)≥(A)≥(B). Furthermore, in the organic EL device of Example 1, the distribution characteristics of the light emitted into the substrate were such that, when the maximum of the spectral radiance at the maximum emission wavelength of the red light or the green light was (D) and the value of the spectral radiance in the axial direction perpendicular to the plane direction of the substrate at the maximum emission wavelength of the red light or the green light was (E), the ratio of the value (E) to the maximum (D) ((E)/(D)) was 0.7 or smaller.

Figure 4:
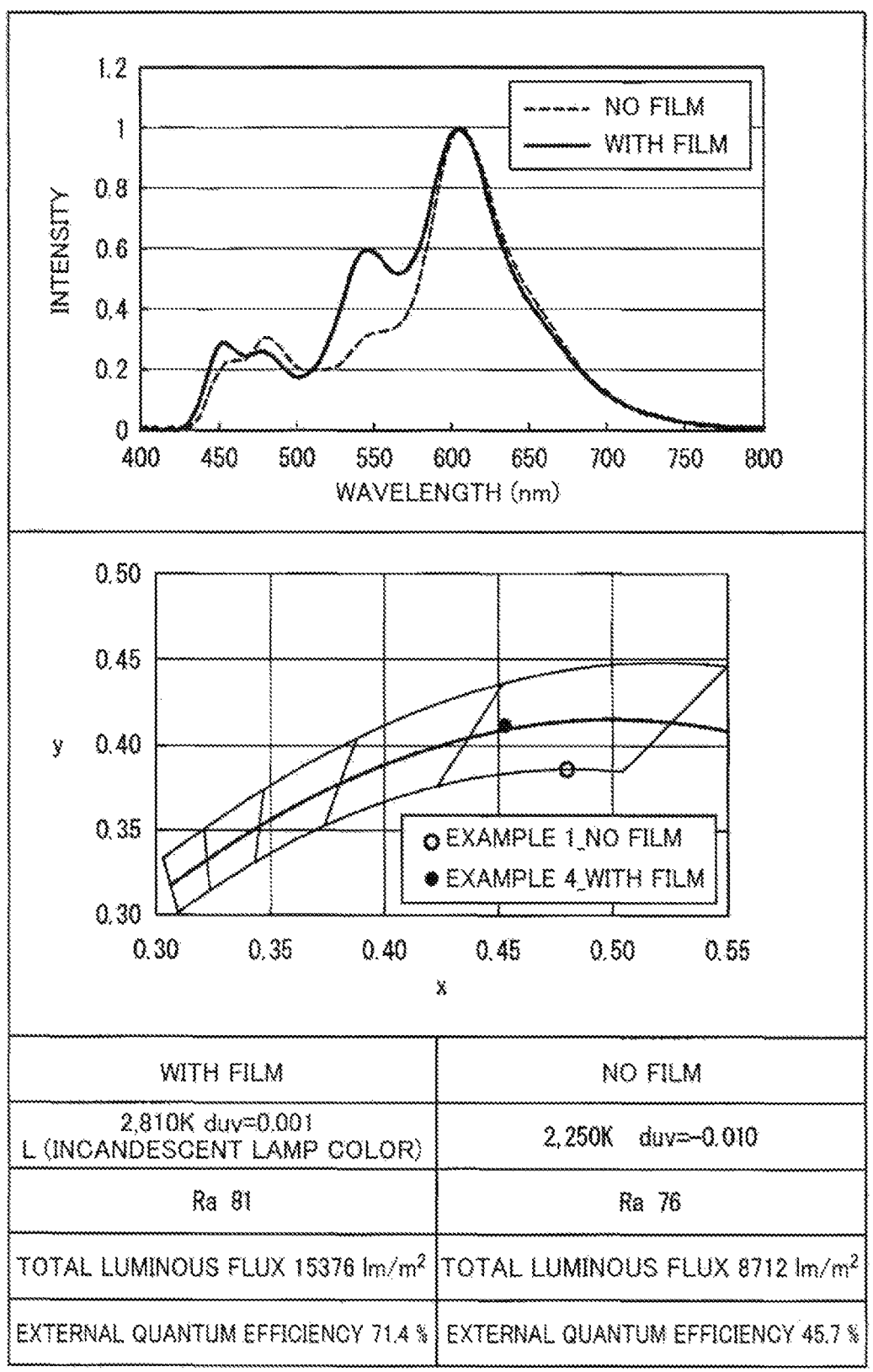
FIG. 4 is a view illustrating evaluation results of the organic EL device of Example 1 and a lighting device of Example 4.

The organic EL device of Example 1 can be thus preferably optimized in total luminous flux. As illustrated in FIG. 4, the organic EL device of Example 1 was able to provide white light with a total luminous flux of 8000 lm/m$^2$ or more. Moreover, the organic EL device of Example 1 was able to provide white light with an external quantum efficiency of 40% or more by being optimized in total luminous flux.

Example 2

An organic EL device of Example 2 having a schematic structure illustrated in FIG. 6 was manufactured by using the same manufacturing method as that in Example 1.

Figure 7:
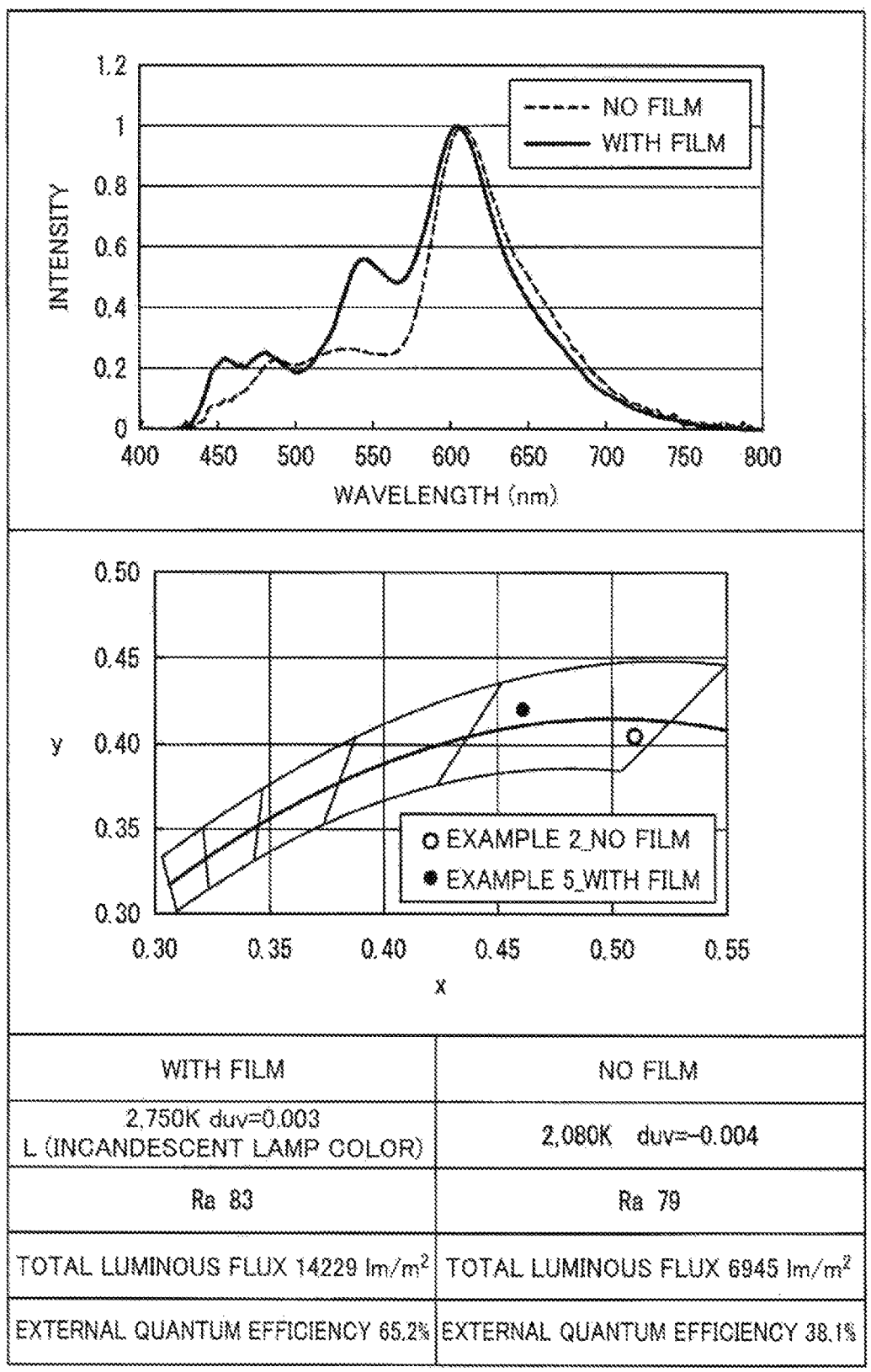
FIG. 7 is a view illustrating evaluation results of the organic EL device of Example 5 and a lighting device of Example 4.

Then, the organic EL device of Example 2 was evaluated in the same methods as those in Example 1. The results of the evaluations are illustrated in FIGS. 7 and 8.

Figure 8:
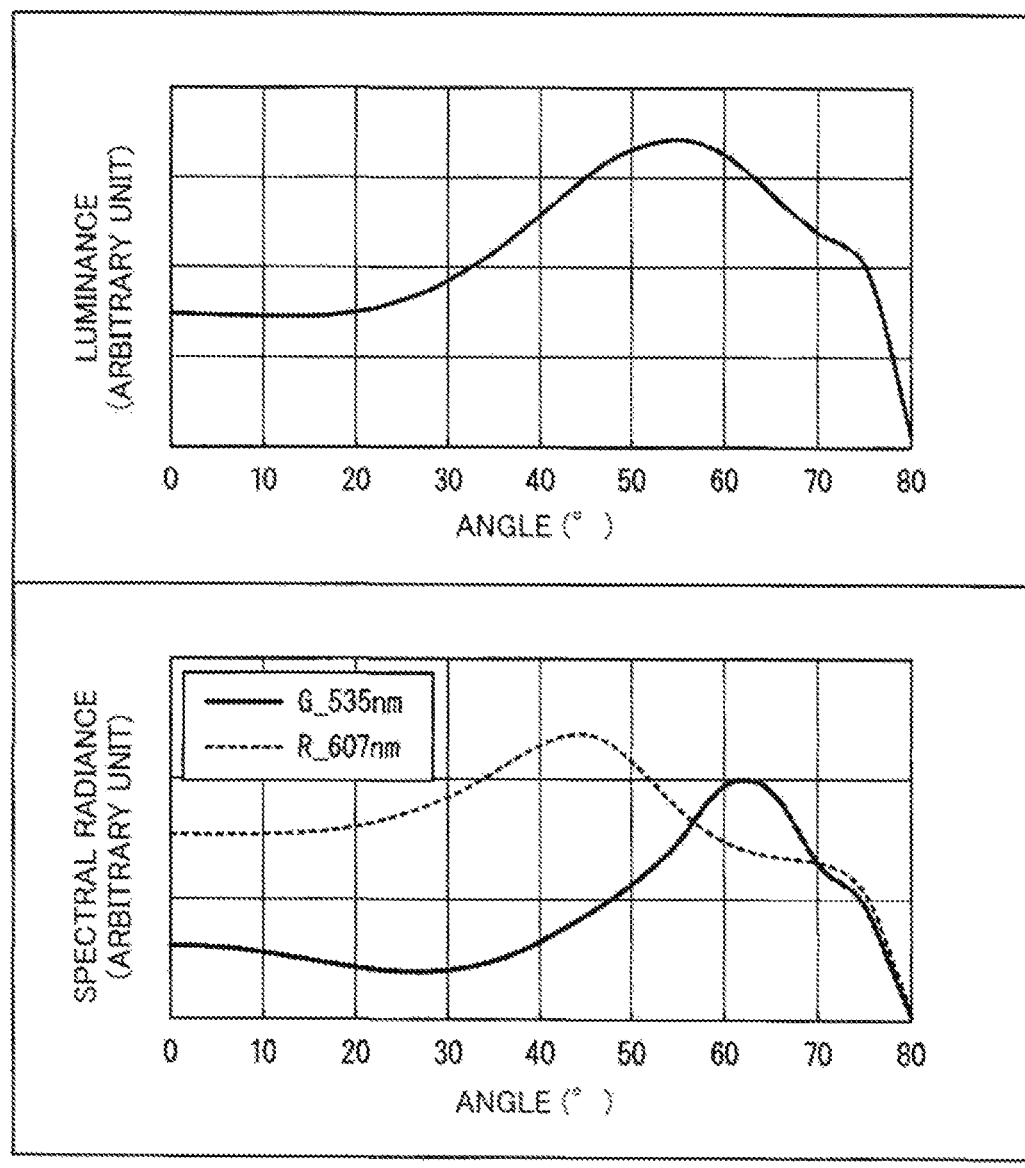
FIG. 8 is graphs illustrating distribution characteristics of light emitted into a substrate of the organic EL device of Example 2.

As illustrated in FIG. 8, it was found that, in the organic EL device of Example 2, the distribution characteristics of the light emitted into the substrate were such that the luminance of the white light took the maximum at the angle of 55 degrees as viewed in the direction of the axis perpendicular to the plane direction of the substrate. Moreover, it was found that the spectral radiance at the maximum emission wavelength of the red light (607 nm) took the maximum at 45 degrees with respect to the axis perpendicular to the plane direction of the substrate and the spectral radiance at the maximum emission wavelength of the green light (535 nm) took the maximum at 65 degrees with respect to the axis perpendicular to the plane direction of the substrate and both spectral radiances took the maxima in the angle range of 30 to 70 degrees with respect to the axis perpendicular to the plane direction of the substrate. Moreover, it was also found that, in both of the red light and the green light, the maximum of the spectral radiance at the maximum emission wavelength was higher than the value of the spectral radiance in the axial direction perpendicular to the plane direction of the substrate.

Moreover, in the organic EL device of Example 2, the distribution characteristics of the light emitted into the substrate were such that, when: the angle at which the luminance of the white light was maximum was (A); the angle at which the spectral radiance at the maximum emission wavelength of the red light was maximum was (B); and the angle at which the spectral radiance at the maximum emission wavelength of the green light was maximum was (C) with the axis perpendicular to the plane direction of the substrate being the reference, the angle (A), the angle (B), and the angle (C) satisfied the relationship of (C)≥(A)≥(B). Furthermore, in the organic EL device of Example 2, the distribution characteristics of the light emitted into the substrate were such that, when the maximum of the spectral radiance at the maximum emission wavelength of the red light or the green light was (D) and the value of the spectral radiance in the axial direction perpendicular to the plane direction of the substrate at the maximum emission wavelength of the red light or the green light was (E), the ratio of the value (E) to the maximum (D) ((E)/(D)) was 0.7 or smaller.

The organic EL device of Example 2 can be thus preferably optimized in total luminous flux. As illustrated in FIG. 7, the organic EL device of Example 2 was able to provide white light with a total luminous flux of 6000 lm/m² or more. Moreover, the organic EL device of Example 2 was able to provide white light with an external quantum efficiency of 30% or more by being optimized in total luminous flux.

Example 3

An organic EL device of Example 3 having a schematic structure illustrated in FIG. 9 was manufactured by using the same manufacturing method as that in Example 1.

Figure 10:
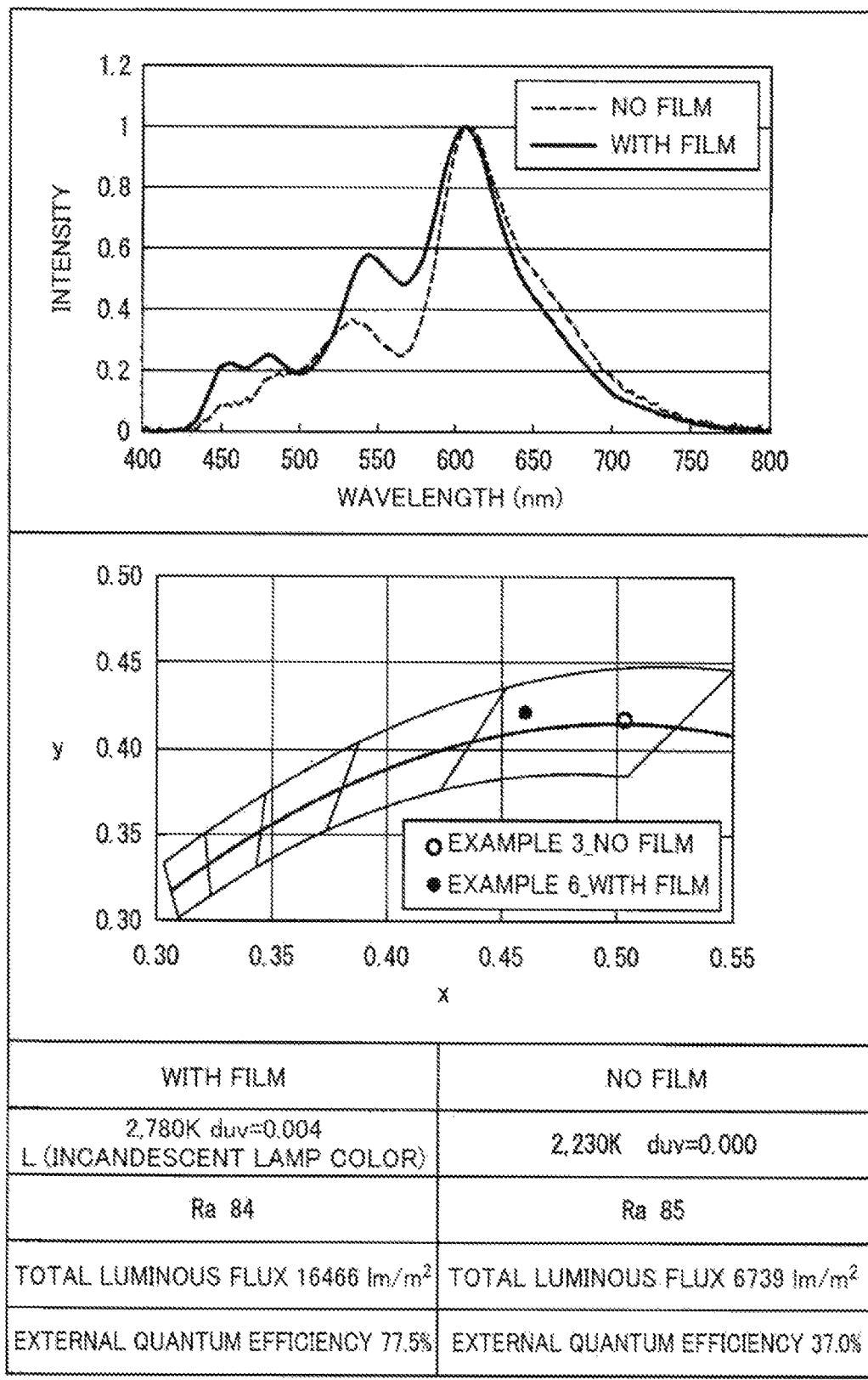
FIG. 10 is a view illustrating evaluation results of the organic EL device of Example 3 and a lighting device of Example 6.
Figure 11:
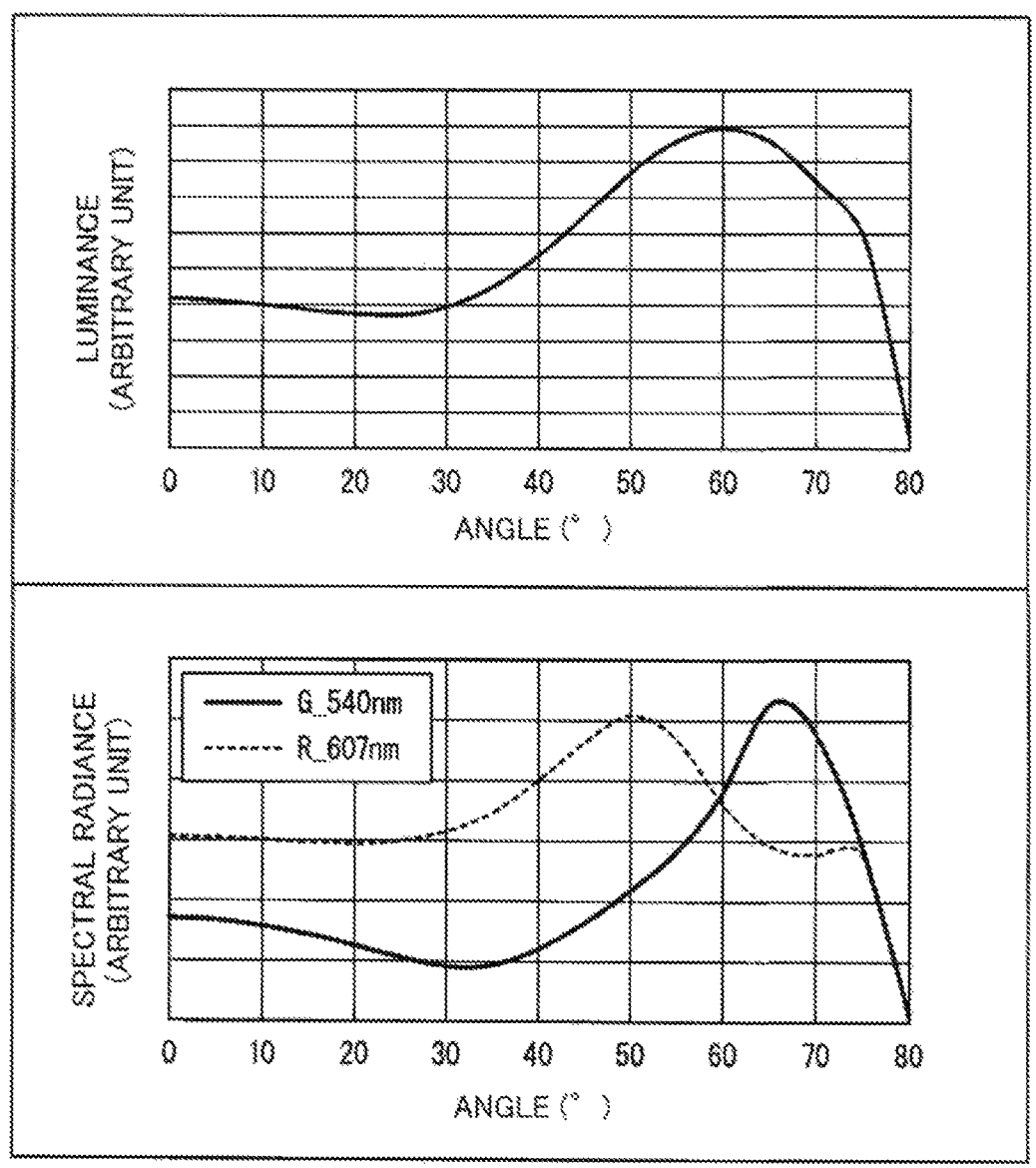
FIG. 11 is graphs illustrating distribution characteristics of light emitted into a substrate of the organic EL device of Example 3.

Then, the organic EL device of Example 3 was evaluated in the same methods as those in Example 1. The results of the evaluations are illustrated in FIGS. 10 and 11. Aluminum (Al) was used for the cathodes in Examples 1 and 2 while silver (Ag) with high reflectance was used for the cathode in Example 3.

As illustrated in FIG. 11, it was found that, in the organic EL device of Example 3, the distribution characteristics of the light emitted into the substrate were such that the luminance of the white light took the maximum at the angle of 60 degrees as viewed in the direction of the axis perpendicular to the plane direction of the substrate. Moreover, it was found that the spectral radiance at the maximum emission wavelength of the red light (607 nm) took the maximum at 50 degrees with respect to the axis perpendicular to the plane direction of the substrate and the spectral radiance at the maximum emission wavelength of the green light (540 nm) took the maximum at 65 degrees with respect to the axis perpendicular to the plane direction of the substrate and both spectral radiances took the maxima in the angle range of 30 to 70 degrees with respect to the axis perpendicular to the plane direction of the substrate. Moreover, it was also found that, in both of the red light and the green light, the maximum of the spectral radiance at the maximum emission wavelength was higher than the value of the spectral radiance in the axial direction perpendicular to the plane direction of the substrate.

Moreover, in the organic EL device of Example 3, the distribution characteristics of the light emitted into the substrate were such that, when: the angle at which the luminance of the white light was maximum was (A); the angle at which the spectral radiance at the maximum emission wavelength of the red light was maximum was (B); and the angle at which the spectral radiance at the maximum emission wavelength of the green light was maximum was (C) with the axis perpendicular to the plane direction of the substrate being the reference, the angle (A), the angle (B), and the angle (C) satisfied the relationship of (C)≥(A)≥(B). Furthermore, in the organic EL device of Example 3, the distribution characteristics of the light emitted into the substrate were such that, when the maximum of the spectral radiance at the maximum emission wavelength of the red light or the green light was (D) and the value of the spectral radiance in the axial direction perpendicular to the plane direction of the substrate at the maximum emission wavelength of the red light or the green light was (E), the ratio of the value (E) to the maximum (D) ((E)/(D)) was 0.7 or smaller.

As described above, the organic EL device of Example 3 can thus preferably optimize the total luminous flux. As illustrated in FIG. 10, the organic EL device of Example 3 was able to provide white light with a total luminous flux of 6000 lm/m² or more. Moreover, the organic EL device of Example 3 was able to provide white light with an external quantum efficiency of 30% or more by being optimized in total luminous flux.

Example 4

A lighting device in which an optical film was attached to the light extraction surface (anode) side of the aforementioned organic EL device of Example 1 was manufactured.

Then, the lighting device of Example 4 was evaluated in the same methods as those in Example 1. The results of the evaluations are illustrated in FIG. 4.

As illustrated in FIG. 4, it was found that, in the lighting device of Example 4, attaching the optical film onto the light extraction surface (anode) side of the organic EL device changed the shape of the emission spectrum from that in the case where no optical film was attached (illustrated by a broken line in the graph). Particularly, it was found that the light emission intensity at the maximum emission wavelength of the green light was relatively higher.

In the lighting device of Example 4, the total luminous flux can be thereby more preferably optimized. As illustrated in FIG. 4, the lighting device of Example 4 was able to provide white light with a total luminous flux of 15000 lm/m² or more. Moreover, the lighting device of Example 4 was able to provide white light with an external quantum efficiency of 70% or more by being optimized in the total luminous flux.

Example 5

A lighting device in which an optical film was attached to the light extraction surface (anode) side of the aforementioned organic EL device of Example 2 was manufactured.

Then, the lighting device of Example 5 was evaluated in the same methods as those in Example 1. The results of the evaluations are illustrated in FIG. 7.

As illustrated in FIG. 7, it was found that, in the lighting device of Example 5, attaching the optical film onto the light extraction surface (anode) side of the organic EL device changed the shape of the emission spectrum from that in the case where no optical film was attached (illustrated by a broken line in the graph). Particularly, it was found that the light emission intensity at the maximum emission wavelength of the green light was relatively higher.

In the lighting device of Example 5, the total luminous flux can be thereby more preferably optimized. As illustrated in FIG. 7, the lighting device of Example 5 was able to provide white light with a total luminous flux of 14000 lm/m$^2$ or more. Moreover, the lighting device of Example 3 was able to provide white light an external quantum efficiency of 60% or more by being optimized in the total luminous flux.

Example 6

A lighting device in which an optical film was attached to the light extraction surface (anode) side of the aforementioned organic EL device of Example 3 was manufactured.

Then, the lighting device of Example 6 was evaluated in the same methods as those in Example 1. The results of the evaluations are illustrated in FIG. 10.

As illustrated in FIG. 10, it was found that, in the lighting device of Example 6, attaching the optical film onto the light extraction surface (anode) side of the organic EL device changed the shape of the emission spectrum from that in the case where no optical film was attached (illustrated by a broken line in the graph). Particularly, it was found that the light emission intensity at the maximum emission wavelength of the green light was relatively higher.

In the lighting device of Example 6, the total luminous flux can be thereby preferably optimized. As illustrated in FIG. 10, the lighting device of Example 6 was able to provide white light with a total luminous flux of 16000 lm/m$^2$ or more. Moreover, the lighting device of Example 6 was able to provide white light with an external quantum efficiency of 70% or more by being optimized in the total luminous flux.

Example 6 in which silver was used for the cathode was able to achieve a higher total luminous flux and a higher external quantum efficiency than Examples 4 and 5 in which aluminum was used for the cathode. Using silver with high reflectance as an electrode as described above enabled the lighting device to achieve a higher total luminous flux value and a higher external quantum efficiency.

INDUSTRIAL APPLICABILITY

According to one aspect described above, it is possible to provide an organic electroluminescent device which can provide white light with high luminous efficiency by being optimized in total luminous flux and is thus suitable for a lighting device and also provide a lighting device including this organic electroluminescent device.

DESCRIPTION OF REFERENCE NUMERALS

10 organic electroluminescent device (organic EL device)
10' organic EL element
11 first electrode
12 second electrode
13A first light emitting unit (light emitting unit)
13B second light emitting unit (light emitting unit)
13C third light emitting unit (light emitting unit)
14A first charge generating layer (charge generating layer)
14B second charge generating layer (charge generating layer)
15A first electron transport layer
15B second electron transport layer
15C third electron transport layer
16A first light emitting layer
16B second light emitting layer
16C third light emitting layer
17A first hole transport layer
17B second hole transport layer
17C third hole transport layer
18 substrate
100 lighting device
110 base substrate
111 anode terminal electrode
113 sealing substrate
114 sealing member
115 gap

The invention claimed is:

1. An organic electroluminescent device having a structure in which a plurality of light emitting units each including a light emitting layer made of at least an organic compound are stacked one on top of another between a first electrode and a second electrode with a charge generating layer sandwiched between each pair of the adjacent light emitting units, the organic electroluminescent device capable of providing white light through a substrate adjacent to the first electrode or the second electrode by causing the plurality of light emitting units to emit light, wherein
the white light produced by light emission of the plurality of light emitting units is formed of red light, green light, and blue light,
distribution characteristics of light emitted into the substrate are such that a luminance of the white light takes a maximum in an angle range of 20 to 60 degrees with respect to an axis perpendicular to a plane direction of the substrate, and
a spectral radiance at a maximum emission wavelength of the red light and a spectral radiance at a maximum emission wavelength of the green light each take a maximum in an angle range of 30 to 70 degrees with respect to the axis perpendicular to the plane direction of the substrate and the maxima are higher than a value of the spectral radiance in an axial direction perpendicular to the plane direction of the substrate at the maximum emission wavelength of the red light and a value of the spectral radiance in the axial direction perpendicular to the plane direction of the substrate at the maximum emission wavelength of the green light, respectively.

2. The organic electroluminescent device according to claim 1, wherein the distribution characteristics of light emitted into the substrate are such that, when: an angle at which the luminance of the white light is maximum is (A); an angle at which the spectral radiance at the maximum emission wavelength of the red light is maximum is (B); and an angle at which the spectral radiance at the maximum emission wavelength of the green light is maximum is (C) with the axis perpendicular to the plane direction of the substrate being a reference, the angle (A), the angle (B), and the angle (C) satisfy a relationship of (C)≥(A)≥(B).

3. The organic electroluminescent device according to claim 1, wherein the distribution characteristics of light emitted into the substrate are such that, when the maximum of the spectral radiance at the maximum emission wavelength of the red light or the green light is (D) and the value of the spectral radiance in the axial direction perpendicular to the plane direction of the substrate at the maximum emission wavelength of the red light or the green light is (E), a ratio of the value (E) to the maximum (D) ((E)/(D)) is 0.7 or smaller.

4. The organic electroluminescent device according to claim 1, comprising:
a first light emitting unit formed of a red light emitting unit including a red light emitting layer which emits the red light;
a second light emitting unit formed of a blue light emitting unit including a blue light emitting layer which emits the blue light; and
a third light emitting unit formed of a green light emitting unit including a green light emitting layer which emits the green light, wherein
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween, and
the organic electroluminescent device has a structure in which the second electrode, the third light emitting unit, the second charge generating layer, the second light emitting unit, the first charge generating layer, the first light emitting unit, and the first electrode are stacked one on top of another in this order.

5. The organic electroluminescent device according to claim 1, wherein
the charge generating layer is formed of an electrically insulating layer made of an electron accepting material and an electron donating material, and
a specific resistance of the electrically insulating layer is $1.0 \times 10^2$ Ω·cm or more.

6. The organic electroluminescent device according to claim 5, wherein the specific resistance of the electrically insulating layer is $1.0 \times 10^5$ Ω·cm or more.

7. The organic electroluminescent device according to claim 1, characterized in that
each of the charge generating layers is formed of a mixed layer of different materials and one component of the mixed layer forms a charge transfer complex by redox, and
when voltage is applied between the first electrode and the second electrode, charges in the charge transfer complex move to the first electrode side and the second electrode side to cause holes to be injected into one light emitting unit located on the first electrode side of the charge generating layer and cause electrons to be injected into another light emitting unit located on the second electrode side of the charge generating layer.

8. The organic electroluminescent device according to claim 1, characterized in that
each of the charge generating layers is formed of a laminate of an electron accepting material and an electron donating material, and
when voltage is applied between the first electrode and the second electrode, in an interface between the electron accepting material and the electron donating material, charges generated by reaction involving electron transfer between the electron accepting material and the electron donating material move to the first electrode side and the second electrode side to cause holes to be injected into one light emitting unit located on the first electrode side of the charge generating layer and cause electrons to be injected into another light emitting unit located on the second electrode side of the charge generating layer.

9. The organic electroluminescent device according to claim 1, characterized in that the charge generating layers contain a compound having a structure expressed by formula (1):

[Chem. 1]

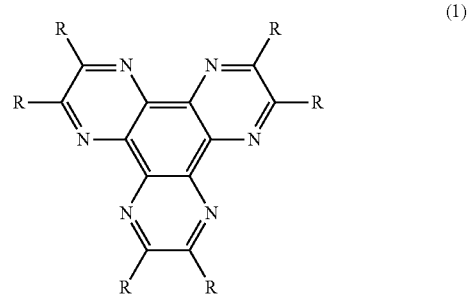

where R represents an electron withdrawing group of F, Cl, Br, I, CN, or CF$_3$.

10. The organic electroluminescent device according to claim 1, wherein the first electrode is made of silver.

11. A lighting device comprising the organic electroluminescent device according to claim 1.

12. The lighting device according to claim 11, comprising an optical film on a light extraction surface side of the organic electroluminescent device.

13. The lighting device according to claim 11, wherein an average color rendering index (Ra) of the white light is 80 or more.

14. The lighting device according to claim 11, wherein
the substrate is a base substrate or a sealing substrate,
the base substrate or the sealing substrate is formed of a flexible substrate, and
the lighting device is flexible.

* * * * *